(12) United States Patent
White (10) Patent No.: US 8,939,683 B1
(45) Date of Patent: Jan. 27, 2015

(54) INVERSE SQUARE TOOL FORM

(76) Inventor: Robert Alvin White, Falcon, MO (US)

( * ) Notice: Subject to any disclaimer, the term of this patent is extended or adjusted under 35 U.S.C. 154(b) by 1577 days.

(21) Appl. No.: 12/535,351

(22) Filed: Aug. 4, 2009

Related U.S. Application Data (63) Continuation-in-part of application No. 11/312,276, filed on Dec. 20, 2005, now Pat. No. 7,588,074.

(60) Provisional application No. 60/638,299, filed on Dec. 21, 2004.

(51) Int. Cl.
*B23B 27/06* (2006.01)

(52) U.S. Cl.
USPC .............................................. 407/61; 407/62

(58) Field of Classification Search
USPC .............. 407/34, 53, 54, 56, 60, 61; 408/230, 408/227
See application file for complete search history.

(56) References Cited

U.S. PATENT DOCUMENTS

| | | | |
|---|---|---|---|
| 1,480,362 A | | 1/1924 | Anderson |
| 2,087,240 A | | 7/1937 | Brown |
| 5,511,145 A | | 4/1996 | Bailey et al. |
| 5,908,269 A | * | 6/1999 | Cox ................................ 407/59 |
| 6,164,877 A | * | 12/2000 | Kamata et al. .................. 407/61 |
| 6,200,078 B1 | * | 3/2001 | Kubota ........................... 409/74 |
| 6,322,296 B1 | * | 11/2001 | Wetli et al. ..................... 407/42 |
| 7,007,382 B2 | * | 3/2006 | Mantel ......................... 29/889.2 |
| 7,588,074 B1 | * | 9/2009 | White ............................. 165/185 |
| 7,927,046 B2 | * | 4/2011 | Tanaka et al. .................... 407/53 |
| 8,567,059 B2 | * | 10/2013 | Jette et al. ..................... 29/889.2 |
| 8,596,934 B2 | * | 12/2013 | Lehto et al. ..................... 407/42 |
| 8,622,661 B2 | * | 1/2014 | Inamasu et al. ................. 407/11 |
| 2008/0193232 A1 | * | 8/2008 | van Iperen ...................... 407/54 |

FOREIGN PATENT DOCUMENTS

GB 2354728 A * 4/2001

OTHER PUBLICATIONS

Linwood TM II ceiling by Architectural Surfaces, Inc., 123 Columbia Court North, Suite 201, Chaska, MN 55318.
Anechoic chamber, p. 7, www.lenardaudio.com. Lenard Audio 32 George St, North Lambton, NSW 2299, Australia.
"ERS-2 Spacecraft and its Payload," Francis, et al., ESA Bulletin 83, Aug. 1995, p. 1 and p. 10.
ACK Technology catalog, 6081 Dale St., Unit C, Buena Park, CA 90621. www.acktechnology.com/image005/png.

* cited by examiner

*Primary Examiner* — Andrea Wellington
*Assistant Examiner* — Sara Addisu
(74) *Attorney, Agent, or Firm* — Richard L. Marsh (57) ABSTRACT

A rotary cutting tool for forming a heat plate has a plurality of cutting blades arranged about a cutting tool body. The cutting edge profile of the rotary cutting tool has a lower radius portion and a middle convex portion. The lower radius portion has its center on the axis of the rotary cutting tool and the middle convex portion is defined by an inverse square curve of form $Y=1/X^2$ with the vertical axis of the origin of the inverse square curve offset from the axis of the rotary cutting tool. X has values between 0.25 units and 4 units.

6 Claims, 8 Drawing Sheets

INVERSE SQUARE TOOL FORM

RELATED APPLICATION DATA

This Application is a non-provisional continuation-in-part application of Applicant's Ser. No. 11/312,276 filed Jul. 6, 2006, now allowed, which is a non-provisional application of Applicant's provisional application Ser. No. 60/638,299 filed on 21 Dec. 2004 and Applicant claims the priority established with the filing thereof. The entire specification of Applicant's provisional application is incorporated into this application by this reference thereto.

BACKGROUND OF THE INVENTION

1. Field of the Invention

This invention relates to a method and apparatus for improved energy transfer rate using inverse square curve energy transfer interfaces. Materials of different compositions may be employed in devices manufactured according to the teachings of this invention.

2. Prior Art Statement

It is known to provide an acoustical ceiling in the general quadratic curve shape wherein the first panel of the ceiling is arranged above the performance stage at a steep slope, the angle of subsequent panels flattening out as the distance from the stage increases. It is generally accepted that the panels of this acoustical ceiling are arranged in a parabolic shape with the performance stage located at the focus of the parabola since horns, including musical instruments, have long had a parabolic shape. For instance, see the ceiling panels manufactured by Acoustical Surfaces, Inc., located at 123 Columbia Court North, Suite 201, Chaska, Minn. 55318. The panels of the acoustical ceiling of this patent are arranged with the trailing end of each panel disposed above the leading edge of the subsequent panel, thus providing attenuation of sound emanating from the stage. In a parabola, lines of propagation are parallel to the axis of the parabola in accord with the definition of a parabola. Therefore, in a parabolic horn, sound energy is lost behind the source located at the focus of the parabola. Therefore, there is a need for an acoustical ceiling that allows sound to propagate along a curvilinear surface, particularly a curvilinear surface defined by the inverse square relationship to ensure that proper attenuation of sound is accomplished.

Additionally known is an anechoic chamber comprised of walls having a plurality of shaped bolsters alternately arranged in horizontal and vertical pairs. For instance, see the wall foe an anechoic chamber at the website of Lenard Audio, 32 George St, North Lambton, NSW 2299, Australia. The bolsters are generally open cell foam wedge shaped blocks and may comprise intersecting portions of curvilinear surfaces for opposed surfaces of the wedges. There is a need for further attenuation of sound by providing inverse square curve surfaces of revolution as the bolsters of an anechoic chamber.

It is also known to provide a forty-five degree (45°) helically spiraled corrugated metallic pipe in close proximity to an infrared heat lamp to produce a heating device. For instance, see the U.S. Pat. No. 5,511,145 issued on Apr. 23, 1996 to Bailey, et al. Corrugated metal is well known to be sinusoidal in shape which results in absorption of heat into one side of the metal and radiant propagation from the other side. Since the sinusoidal surface is longer in developed length than a straight panel, a greater surface area is available for radiant transfer, however, there is a need for greater surface area for radiant heat transfer which is available using an inverse square curve shape to the corrugations.

It is further known to provide a copper semi-oval shaped reflector to radiate heat toward a top plate. For instance, see U.S. Pat. No. 1,480,362 issued on Jan. 8, 1924 to Oliver N. Anderson. Similar to a parabola, the semi-oval shape may best be described as an ellipse and the heating source of this patent is located at one focus of the ellipse. Therefore, the heat energy concentrates behind the focus resulting in a hot spot at the surface and subsequent rapid oxidation occurs. The need for a method and apparatus for improving energy transfer using a heat transfer surface in the shape of an inverse square curve is still apparent.

Further known is a "cone shaped" support as a light and air conditioning reflector. For instance, see the U.S. Pat. No. 2,087,240 issued on Jul. 20, 1937 to William A. Brown. The shape of the cone also retains energy behind the source and will also rapidly oxidate as do the ellipse and parabolic shapes. Thus, a method and apparatus for improving energy transfer using a heat transfer surface in the shape of an inverse square curve is needed.

It is also known to provide a "shaped beam" antenna and "advanced synthetic aperture radar" thus compensating for the inverse square law variation in received signal power. For instance, see the European Space Agency article entitled "The ERS-2 Spacecraft and its Payload," Francis, et al., ESA Bulletin Nr. 83, August 1995. Received signal power may be further enhanced by providing an antenna in an inverse square curve shape such that the received signal power is directed along the surface of the inverse square curve.

Finally, it is known to provide heat sink pin fins having a generally straight shape but with internally extending slots disposed upon the vertical walls of the pin fins. The inwardly extending slots serve to enhance the heat transfer by increasing the surface area of the heat sink pin fins. For instance, see the heat sink pin fin shapes of ACK Technology, 6081 Dale St., Unit C, Buena Park, Calif. 90621. Heat transfer may be increased by providing heat sink pin fins having the shape of the inverse square curve and further increased by providing inwardly extending slots also having the shape of the inverse square curve or providing the protrusions between the inwardly extending slots in the shape of the inverse square curve.

SUMMARY OF THE INVENTION

Heat is transferred through the exchanger materials by conduction, with metals generally being the best heat conductors and therefore, the most efficient means of conductive heat transfer. Since the temperature difference between transfer mediums determines the rate of heat transfer, maximizing the temperature at the surface of the heat source exchanger material results in the maximum transfer of heat from the heat source to the cold source. Since temperature varies according to the inverse square curve, a constant temperature line is established in heat pin fins, the constant temperature line only intersecting with the right cylindrical wall of a standard heat pin fin at one place, at the base. Thus, a heat pin fin having a general configuration of an inverse square curve of rotation would present the constant temperature line at the external surface therefore improving the rate of heat transfer from the heat pin fin. A truncated metal cone having the inverse square curve sidewall surfaces provides the greatest temperature gradient spread uniformly over the greatest amount of surface area. Furthermore, the cone shape enhances the formation of mushroom shaped heated volume which rapidly removes the heat by convection.

The application is derived from observation of heat rising from a flat horizontal surface wherein a heated volume cone shaped bubble first forms as a hump on the flat horizontal surface. The bubble continues to form upwardly into a rounded head which continues to rise from the flat horizontal surface until eddy currents begin forming along the flat horizontal surface which causes the bubble to break away from the surface. A chimney effect is created by the rising heated currents causing more rapid transformation of the heated material from the flat horizontal surface into a mushroom shaped volume. Once the bubble breaks from the surface, heat is transferred from the surface to the surrounding area and if presented to an inverted cone of similar shape, the heated bubble will lose heat into the cone in a reverse fashion and therefore heat is transferred most efficiently from one surface to another.

The mathematical expression of the inverse square relationship, $Y=1/X^2$, as plotted on a graph represents the ideal shape when applied to materials intended for conduction, radiation and absorption of energy. The application of the inverse square curve to materials such as metals may then be arranged in many useful shapes and surface contours, hereinafter described. Heat conducting material, when produced with this curve as a truncated cone, represents the ideal shape for the most rapid rate of heat transfer across an exchanger by exposing the greatest amount of surface area of the heat sink. Accordingly, the highest heat density per unit area is achieved and heat sinks are therefore most compact.

Therefore, it is an object of this invention to provide a forged pin fin heat sink which comprises a plurality of forged pin fins extending vertically from a plate wherein the forged pin fins comprise a curvilinear surface of revolution in the shape of an inverse square curve. Preferably, the curvilinear surface of revolution is a concave curvilinear surface of revolution, however, the curvilinear surface of revolution may alternately be convex.

It is a further object of this invention to provide a forged pin fin heat sink comprising a plurality of circular base forged pin fins having a curvilinear surface of revolution of an inverse square curve extending vertically from a plate wherein the plate is a concave curvilinear surface of revolution, the curvilinear surface of revolution of the plate in the shape of an inverse square curve, however the curvilinear surface of the plate may alternately be convex.

It is yet another object of this invention to provide a forged pin fin heat sink comprising a plurality of circular base forged pin fins having a curvilinear surface of revolution of an inverse square curve extending vertically from a plate wherein the circular base forged pin fins have the exposed ends thereof truncated at a specified distance from the plate, the truncation of the exposed ends selected from the group consisting of flat, curvilinear, pointed.

Still another object of this invention is to provide a forged pin fin heat sink comprising a plurality of circular base forged pin fins having a curvilinear surface of revolution of an inverse square curve extending vertically from a plate wherein the plurality of circular base forged pin fins are arranged in an array upon the plate. The circular bases of the circular base forged pin fins in the array are preferably contiguous, but may be spaced apart. Also, preferably the circular base forged pin fins in the array are in offset rows and columns to achieve the maximum pack density of circular base forged pin fins upon the plate, however it is within the scope of this invention to make the array are in regular rows and columns.

A significant object of this invention is to provide a heat plate comprising at least one curvilinear surface having a heat source adjacent one end of the one curvilinear surface wherein heat from the heat source radiates from the curvilinear surface and travels along the curvilinear surface projecting from an end of the curvilinear surface opposite the one end. Preferably, the curvilinear surface is joined to a mirror image curvilinear surface at the one ends thereof thus comprising a curved plate having the heat source located at the one ends. The curved heat plate is preferably concave, but may be convex.

A principal aim of this invention is to provide a heat exchanger comprising at least one first fluid passage contiguous with at least one second fluid passage with the passages separated by a common boundary wherein the boundary has a first surface and a second surface, the first surface described by a plurality of curvilinear surfaces joined at the ends thereof into a sinuous curvilinear surface, the second surface described by a plurality of curvilinear surfaces joined at the ends thereof into a sinuous curvilinear surface and wherein the curvilinear surfaces of the first and the second curvilinear surfaces are defined by a portion of an inverse square curve. Preferably, the first surface has a plurality of fins extending therefrom into the first fluid passage and the second surface has a plurality of fins extending therefrom into the second fluid passage wherein the fins comprise mirror image curvilinear surfaces joined at the apices thereof, the curvilinear surfaces defined by a portion of an inverse square curve.

A goal of this invention is to provide a heat exchanger comprising at least one first fluid passage contiguous with at least one second fluid passage wherein the first fluid passage is defined between two of the second fluid passages, the first fluid passage separated from the second fluid passages by separate boundaries between the first fluid passage and the two second fluid passages, the separate boundaries separated by a defined distance, the first fluid passage thus comprising a sinuous path through the heat exchanger.

Yet another aim of this invention is to provide a heat exchanger comprising at least one first fluid passage contiguous with at least one second fluid passage wherein the first fluid passage is defined between two of the second fluid passages, the heat exchanger further comprising a plurality of the first passages and a plurality of the second passages wherein the number of passages in the plurality of second passages exceeds the number of passages in the plurality of first passages.

An objective of this invention is to provide a radio frequency antenna which transmits radio frequency energy along an inverse square curvilinear surface.

Still another aim of this invention is to provide a radio frequency receiving antenna which receives radio frequency energy along an inverse square curvilinear surface, channeling the received signal to a receiver at one end of the inverse square curvilinear surface.

Another objective of this invention is to provide sound absorption bolsters having surfaces in the general shape of the inverse square curvilinear surface to absorb sound along the curvilinear surface for greater acoustic damping.

Still another aim of this invention is to provide a heat pipe having a inverse square curve curvilinear shape wherein condensation of the fluid in the heat pipe condenses along the constant temperature line with the fluid traveling toward the reservoir along the constant temperature line defined by the inverse square curvilinear interior surface.

Yet another goal of this invention is to provide a cooling tower having an inverse square curvilinear inside surface thus establishing a constant temperature line of condensation.

Still another primary goal of this invention is to provide a rotary cutting tool for forming a heat plate that has a plurality of cutting blades disposed axially upon and circumferentially about a cutting tool body. The rotary cutting tool has a cutting edge profile comprising a lower radius portion and a middle convex portion with the lower radius portion having a center on a rotational axis of the rotary cutting tool and the middle convex portion defined by an inverse square curve of form $Y=1/X^2$ wherein the profile has values of X between 0.25 inches and 4 inches and wherein a vertical axis of an origin of the inverse square curve is offset from the rotational axis by a maximum selected value of X and a horizontal axis of the origin offset from a tangent of the lower radius portion by a value of Y at the maximum selected value of X.

Yet another principal aim of this invention is to provide a tool for forming a portion of a material sheet into a defined shape has a concave surface of revolution wherein a profile of the surface is defined by an inverse square curve of form $Y=1/X^2$ having an origin on the centerline of the tool.

Yet another objective of this invention is to provide a rotary cutting tool for cutting a mold form that has a plurality of cutting blades disposed axially upon and circumferentially about a cutting tool body wherein the cutting edge profile comprises a lower radius portion and a middle concave portion with the lower radius portion having a center on a rotational axis of the rotary cutting tool and the middle concave portion defined by an inverse square curve of form $Y=1/X^2$ wherein the profile has values of X between 0.25 inches and 4 inches and the inverse square curve is oriented on a centerline of the tool.

DESCRIPTION OF THE PREFERRED EMBODIMENTS

While the various features of this invention are hereinafter described and illustrated as a method and apparatus for improved energy transfer rate using inverse square curve energy transfer interfaces, it is to be understood that the various features of this invention can be used singly or in various combinations thereof as can hereinafter be appreciated from a reading of the following description.

Figure 1:
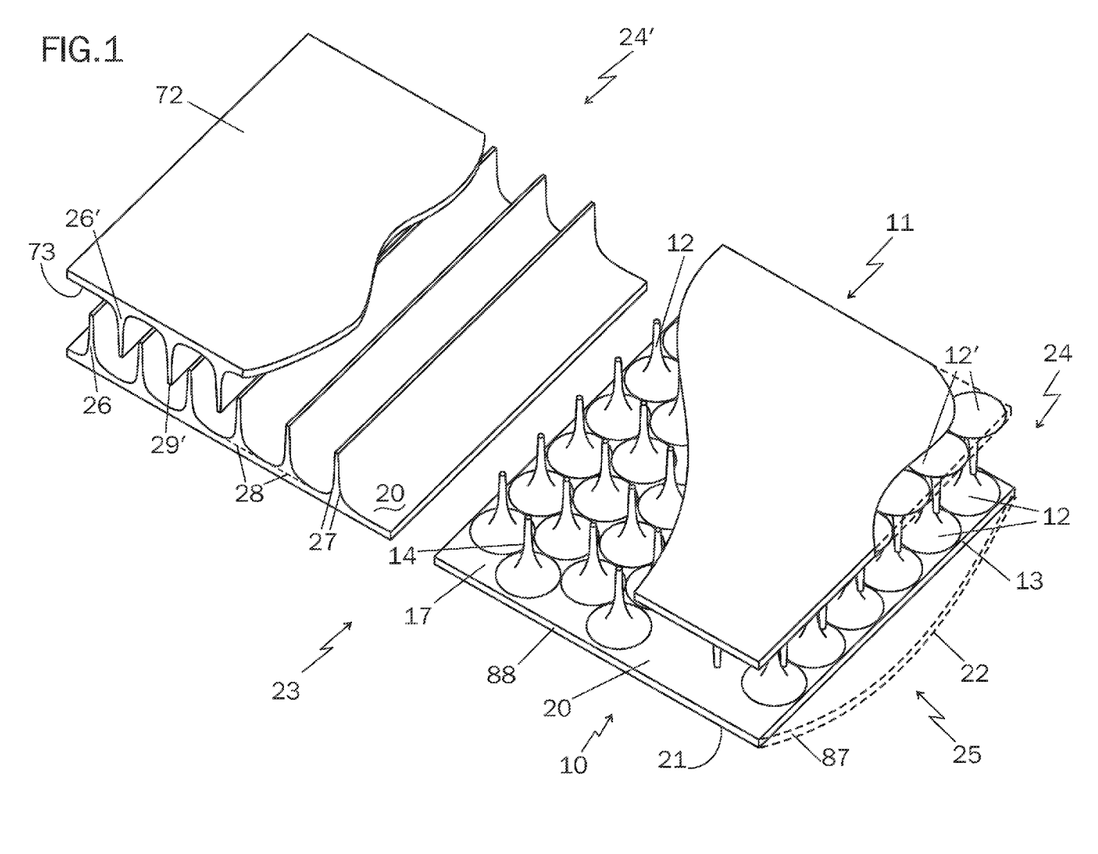
FIG. 1 is a perspective view of an embodiment of a pin fin heat sink having pin fins in the preferred shape of the inverse square curve.
Figure 3:
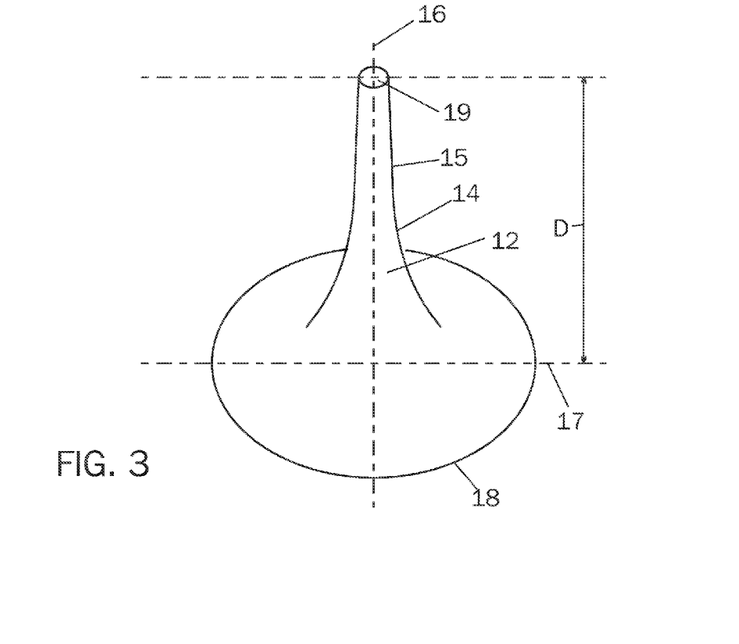
FIG. 3 is an enlarged perspective view of the circular base forged pin fins of the embodiment shown in FIG. 1.

Referring now to FIG. 1, a forged pin fin heat sink 10 comprises a plurality 11 of circular base forged pin fins 12 extending vertically from a plate 13, the circular base forged pin fins 12 comprising a curvilinear surface of revolution 14, curvilinear surface of revolution 14 having the general shape of an inverse square curve defined by the equation $Y=1/X^2+C$, C representing a constant to displace the inverse square curve from the vertical axis when desired. Since the inverse square curve is infinite in length along both axes of a graph, it is obvious that it is practical to use only a portion of the inverse square curve adjacent the origin. Preferably, when C=0, the portion of the curve defined by 0.25>x>4 is best used to advantage, however, it is fully within the scope of this invention to utilize any portion of the inverse square curve to accomplish the purposes herein described. Referring also to FIG. 3, preferably, forged pin fin heat sink 10 has circular base forged pin fins 12 with curvilinear surface of revolution 14 disposed as a concave curvilinear surface of revolution 15. Curvilinear surface of revolution 14 is defined about axis 16 wherein an inverse square curve is rotated about vertical axis 16 through 360 degrees to complete circular base forged pin fin 12. Circular base forged pin fin 12 rests upon a circular base 18 substantially contiguous with a horizontal axis 17. Thus the inverse square curve describing concave curvilinear surface of revolution 15 is defined by the equation $Y=1/X^2+C$ where C=0 and X varies between 0.25 and 4 units from vertical axis 16. Circular base forged pin fin 12 is then translated toward axis 17 until base 18 rests upon horizontal axis 17, horizontal axis 17 contiguous with an upper surface 20 of plate 13. In a heat sink, such as forged pin fin heat sink 10, plate 13 has a heat source, usually an electronic device, not shown, affixed to the underside 21 thereof wherein heat from the heat source is conducted through plate 13 and dissipated to a cold source, such as the atmosphere, by circulating air over upper surface 20. Forged pin fin heat sink 10 has plurality 11 of circular base forged pin fins 12 disposed thereupon to assist with dissipation of heat from plate 13, plurality 11 of circular base forged pin fins 12 having substantially the same surface area as cylindrical forged pin fins, however, circular base forged pin fins 12 having curvilinear surface of revolution 14 are more efficient in dissipation of heat from plate 13 as the exterior surface constitutes curvilinear surface of revolution 14 which extends from circular base 18 to terminal end 19. Since circular base forged pin fins 12 of this invention are preferably contiguous one with another, the entirety of upper surface 20 of plate 13 has heat transmitted therefrom, the heat radiating from the entirety of curvilinear surface of revolution 14 as curvilinear surface of revolution 14 is substantially at the same temperature as plate 13 whereas in a cylindrical forged pin fin, the external surface thereof is generally lower in temperature than plate 13 because the constant temperature line is disposed inwardly of the exterior surface. Therefore, it is clear that curvilinear surface of revolution 14, which is substantially at the same temperature as plate 13, provides superior heat transfer capacity over the known cylindrical forged pin fins.

In the preferred embodiment shown in FIG. 1 in solid lines, plate 13 of forged pin fin heat sink 10 is a flat plate, however, plate 13 may itself be a curvilinear surface of revolution 22 in the shape of an inverse square curve, curvilinear surface of revolution 22 shown in dashed lines. Generally, larger heat dissipation devices utilize curvilinear surface of revolution 22 as plate 13 having plurality 11 of circular base forged pin fins 12 extending into at least one fluid passage as will hereinafter be fully disclosed. Typically, larger heat dissipation devices are constructed with curvilinear surface of revolution 22 as a concave curvilinear surface.

As hereinbefore stated, circular base forged pin fins 12 have a curvilinear surface of revolution 14 as the exterior surface thereof, curvilinear surface of revolution 14 described by a portion of an inverse square curve having the general formula $Y=1/X^2+C$, which has no terminus. Therefore, circular base forged pin fins 12 of forged pin fin heat sink 10 preferably have the exposed terminal ends 19 thereof truncated at a specified distance D from horizontal axis 17 and thus also from plate 13. Preferably, exposed terminal ends 19 are flat, however may also be curvilinear or pointed. When curved, terminal ends 19 may be hemispherical having a radius equal to $(X)_d+C$, that is, the value of X at distance D plus the translation distance C from axis 16, and similarly, when pointed as with a right circular cone, the base of the cone may have a radius equal to $(X)_d+C$. It is also within the scope of this invention to provide a curvilinear surface for terminal ends 19 in the shape of an inverse square curve. As the horizontal leg of the inverse square curve is asymptotic to the horizontal axis as X increases in the same manner as the vertical leg approaches the vertical axis as X decreases, it should be readily apparent then that circular base 18 of each of circular base forged pin fins 12 of this invention has been truncated. Preferably, for circular bases 18, inverse square curve is truncated at $(X)_d=4$ though a greater or lesser number may be used while still falling within the scope of this invention. Since circular bases 18 are generally truncated at $(X)_d=4$, terminal ends 19 are displaced from axis 16 by a distance of 0.25, circular base forged pin fins have a height from base 18 about four times the radius of base 18 wherein the height is substantially equal to distance D. Of course, it is fully within the scope of this invention to make any of circular base forged pin fins 12 greater in height than adjacent circular base forged pin fins 12 or to make all circular base forged pin fins 12 of the same height as depicted in FIG. 1.

Referring again to FIG. 1, forged pin fin heat sink 10 preferably has plurality 11 of circular base forged pin fins 12 arranged in an array 23 upon plate 13 though a random arrangement is fully within the scope of this invention. Most preferably, forged fin pin heat sink 10 plurality 11 of circular base forged pin fins 12 arranged in the array 23 upon plate 13 have circular bases 18 thereof contiguous with circular bases 18 of two adjacent circular base forged pin fins 12 in two adjacent rows 24 and thus circular base forged pin fins 12 in array 23 have rows 24 offset from columns 25, however, the alternate arrangement of regular rows 24 and columns 25 as shown in FIG. 1 with adjacent circular base forged pin fins 12 in each row and each column having circular bases 18 thereof touching is also within the scope of this invention. Alternately, forged fin pin heat sink 10 may have circular bases 18 of adjacent circular base forged pin fins 12 in array 23 spaced apart by a defined distance. Array 23, when employing spaced apart circular base forged pin fins 12 is usually employed in lower heat rate transmission applications.

Still referring to FIG. 1, it is also within the scope of this invention to provide elongated fins 26 disposed upon upper surface 17 of plate 13, fins 26 having side surfaces 27 in the general form of an inverse square curve. Fins 26 are preferably arranged upon plate 13 with the bases 28 thereof substantially contiguous, however, it is possible to space apart fins 26 by a specified distance, usually at least the width of terminal end 29 such that fins 26 may be interdigitated with fins 26' from an underside 73 of a heat receiving plate 72 disposed above plate 13 by a distance at least equal to the height of fins 26. Only a portion of heat receiving plate 72 is shown, that portion disposed over the first three fins 26 on plate 13 as these fins 26 are spaced apart by the width of terminal end 29', terminal end 29' of fin 26' on inverted plate 13' contiguous with upper surface 17 of plate 13. Alternately, fins 26' may be of different height than fins 26 and/or fins 26, 26' may have un-equal spacing wherein the spacing of fins 26' is a whole or fractional multiple of the spacing of fins 26. In like manner to fins 26, circular base forged pin fins 12 may be interdigitated with circular base forged pin fins 12', four circular base forged pin fins 12' of a row 24' shown interdigitated with one row 24 of circular base forged pin fins 12 on base 13, it being fully understood that plate 72 has circular base forged pin fins 12' affixed to underside surface 73 thereof in place of fins 26. Interdigitating of forged pins 12, 12' produce a tortuous path for circulation of a fluid therebetween, the fluid carrying heat away from both plates 13, 72. Of course, it is equally possible within the scope of this invention to have heat transferred from circular base forged pin fins 12 to circular base forged pin fins 12' through a medium filling the space between interdigitated pin fins 12, 12' wherein heat is transferred between plates 13 and 72 one plate 13, 72 associated with a heat source while the other plate 72, 13 is associated with a cold sink. It is also within the scope of this invention to provide alternate shapes for circular base forged pin fins 12, 12'. For instance, referring now to FIG. 6, alternate shapes such as tri-lobed base forged pin fins 12a, 12b, T-shaped forged pin fins 12c, tripod base forged pin fins 12d, cross shaped forged pins 12e or combinations thereof have been found to be useful, though these shapes are neither comprehensive nor exhaustive. The vertical surfaces, though not shown, of the aforementioned alternate shapes 12a-12e for circular base forged pin fins 12 have the general form of the inverse square curve of this invention. In the case of the tri-lobed base forged pin fins 12a-b, portions of the vertical surfaces have varying lengths of the inverse square curve to provide for interlacing of the bases 18 *a-b* thereof. In addition, the straight legged forged pin fins 12 *c-e* may have an end 74 of one leg 39 affixed to headers 75, 76 disposed vertically along plates 13, 72 wherein a tortuous path is established between the remaining legs 39.

Figure 5:
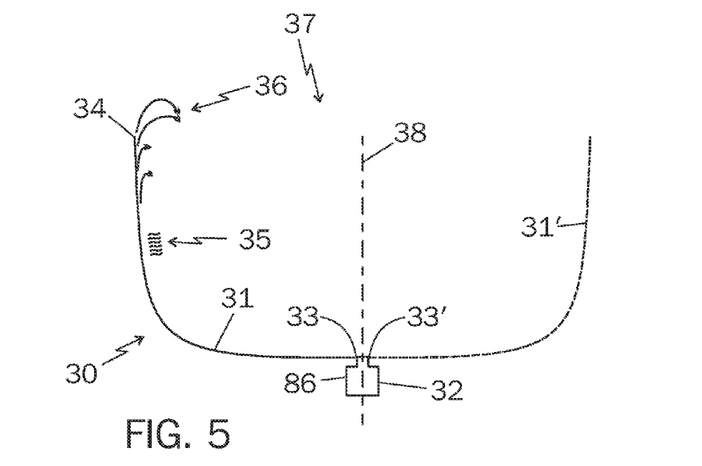
FIG. 5 is frontal view of a heat plate having a heat source at one end, the heat plate having the preferred shape of an inverse square curve.

Referring now to FIG. 5, a heat plate 30 comprising at least one curvilinear surface 31 has a heat source 32 adjacent one end 33 of curvilinear surface 31 wherein heat from the heat source 32 radiates from curvilinear surface 31, as shown at 35, and travels along curvilinear surface 31 projecting from an open end 34 of curvilinear surface 31 opposite one end 33 as shown at 36. Preferably, curvilinear surface 31 is a portion of an inverse square curve described by the general formula $Y=1/X^2+C$. Heat plate 30 may have curvilinear surface joined to a mirror image curvilinear surface 31' at one end 33 thereof thus comprising a curved plate 37 having heat source 32 located at one ends 33, 33'. Preferably, curved plate 37 may be concave as depicted in FIG. 5 but alternately may be convex. Heat source 32 may be chosen from the group consisting of incandescent bulbs, gas or oil flames, resistance heaters, heated fluid tubes, solar energy, heated solids such as stones, marbles, masonry blocks or combinations thereof. Though heat plate 30 and curved plate 37 are shown as planar structures, heat plate 30 may be rotated about an axis 38 passing through one end 33 into a conical structure useful as a heat reflector. Additionally, heat plate 30 may be joined at end 34 by a mirror image of heat plate 30 into a sinuous curve mirror image of heat plate further joined by another mirror image of heat plate 30 and its mirror image, these structures joined end to end extending generally diagonally upwardly and downwardly from heat plate 30 into an elongated heat plate, not shown. Preferably, heat plate 30 is a concave curvilinear surface 31 rotated about axis 38 through 360 degrees with heat source 32 disposed on axis 38 adjacent a central location at one end 33.

Figure 8:
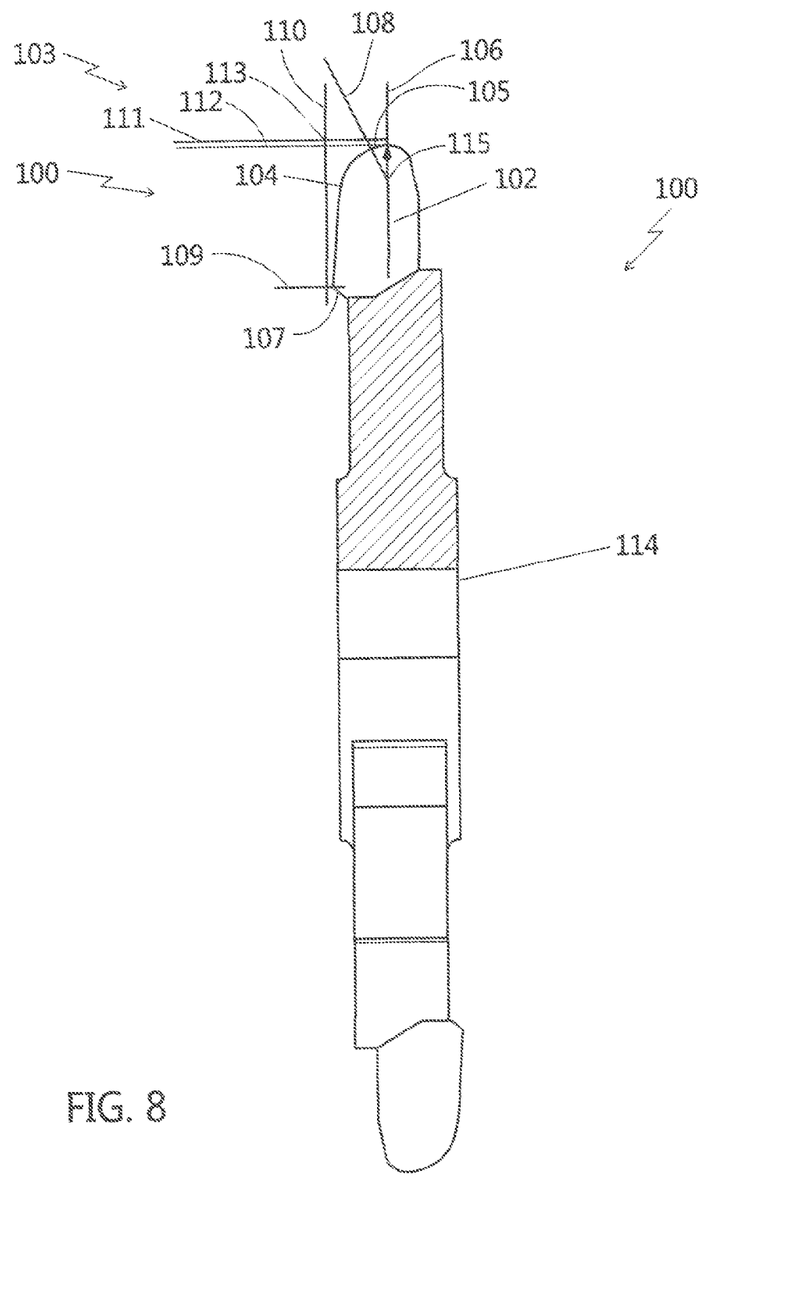
FIG. 8 is a cross section view of a milling cutter provided with at least one insert having an inverse square curve cutting surface.
Figure 9:
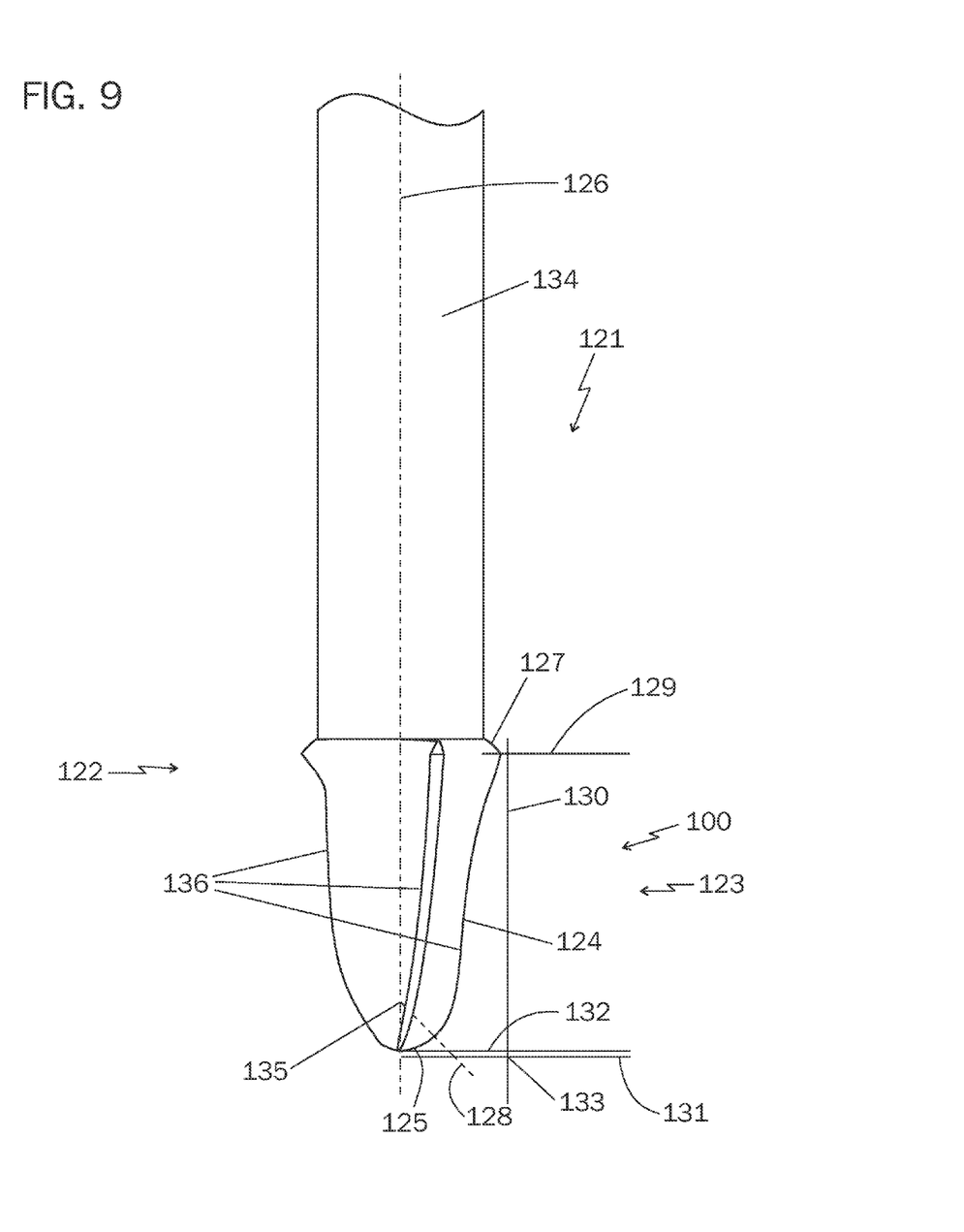
FIG. 9 is a side plan view of a fluted side milling cutter provided with an inverse square curve cutting surface.

An inverse square curve is shown associated with cutters in FIGS. 8-9 and is generally designated by the numeral 100, the formula for an inverse square curve previously set forth above. Inverse square curve 100 is displaced from an origin at 0,0 as an inverse square curve is asymptotic to both axes. Generally, only a portion of the inverse square curve between X=0.25 and X=4.0 units is used to manufacture items for use in industry with a smaller portion lying between X=0.5 and X=2.0 used for designing tool profiles. The entire portion 0.25>X>4.0 is advantageously used for anechoic chamber walls, inverse square curve 100 formed from acoustic panel material by foaming acoustic foam against a reverse of a plate similar to plate 20 of FIG. 1.

Referring now specifically to FIG. 8, a milling cutter 101 is generally shown with at least one insert 102 mounted thereupon. The process of mounting milling cutters to rotary wheels is well known in the art and is not again described herein. Milling cutter 101 is advantageously used to cut grooves in a plate establishing elongated fins 26 of heat plate 13 and/or heat receiving plate 72, plates 13, 72 shown left side of FIG. 1, thus producing heat plate 13 and/or heat receiving plate 72. Preferably, cutting edge profile 103 of an insert 102 of rotary milling cutter tool 101 comprises a lower radius portion 105 and a middle convex portion 104, lower radius portion 105 having a center 115 on a rotational axis 106 of rotary milling cutter tool 101, middle convex portion 104 defined by an inverse square curve of form $Y=1/X^2$ wherein profile has values of X between 0.25 units and 4 units. Cutting surface 103 is described in part by a portion 104 of an inverse square curve, portion 104 joined to a radius 105 disposed on centerline 106 of milling cutter 101. Portion 104 is defined between lines 108 and 109 while radius 105 extends from line 108 through centerline 106. A terminal portion 107 completes insert 102, however, terminal portion 107 is not part of cutting surface 103. Terminal portion 107 may be curvilinear or angled as shown without departing from the scope of this invention. An origin 113 of inverse square curve of portion 104 has a vertical axis 110 offset from rotational centerline 106 of milling cutter tool 101 by a maximum selected value of X and a horizontal axis 111 offset from a tangent 112 of lower radius portion 105 of milling cutter tool 101 by a value of Y at a selected value of X. Preferably rotary milling cutter tool 101 has a plurality of cutting inserts 102 disposed axially upon and circumferentially about a cutting tool body 114 though only a full profile view of cutting insert 102 and an oppositely disposed cutting insert identical to cutting insert 102 are shown. Cutting inserts 102 are preferably also mounted in opposing pairs alternating around cutter body 114 such that opposed inverse square curve curvilinear surfaces 27 of adjacent elongated fins 26 are simultaneously produced. Multiple fins 26 are produced by indexing milling cutter 101 twice the selected value of X thus producing a truncated top portion 29' of fins 26 equal in width to twice the minimum selected value of X. Of course, it is within the scope of this invention to index milling cutter 101 a distance less than the selected maximum value of X thus producing a shorter truncated portion 29' or more than the selected maximum value of X thus producing a wider truncated portion 29'. It is also within the scope of this invention to index milling cutter 101 sufficiently to produce a sharp point for truncated portion 29'.

Figure 6:
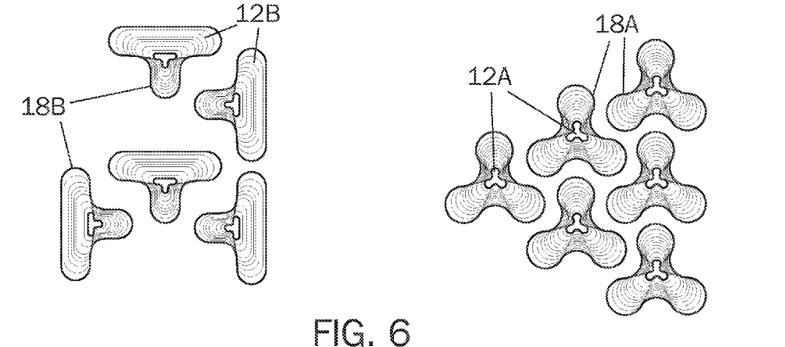
FIG. 6 is a plan view of the base for alternate forged pin fins of the embodiment shown in FIG. 1.

Referring also to FIG. 6, by passing milling cutter tool 101 at diagonal orientations and at least one orthogonal axis across an un-machined plate, singularly standing pin fins 12A and 12D having an inverse square curvilinear surface may be produced while passing milling cutter tool 101 only along orthogonal orientations, singularly standing pin fins 12A, 12C, 12E with inverse square curvilinear surfaces thereupon are possible. It is well known that placement of circular base objects such as circular base pins 12 in a close pack relationship naturally occurs in the 120° orientation shown in the central portion of the right hand side of FIG. 1. Thus, rotary milling cutter 101 may be used to create plate 13 with triangular truncated portions 29 and triangular bases 18 for pin fins 12 by passing rotary milling cutter 101 at 120° angles across an un-machined plate. It is also possible to create pin fins 12 with triangular bases 18 and triangular truncated portions 29 by a shaper machine having at least one shaping tool having inserts 102 mounted thereupon, shaper traversing the shaping tools along 120° axes. The shaping tool may have adjacent shaping bars with a single insert 102 whereupon the shaping tool is passed first along all three 120° axes and thereafter either plate 13 is reversed upon the shaper and the shaping tool passed along each row along all three 120° axes or insert 102 is reversed upon shaping tool and the 120° axes are again traversed in order to create triangular pin fins 12. In like manner, a mold to produce heat plate 13 may be manufactured by using rotary milling cutter 101 or a shaper tool with insert 102 thereupon to produce a mold pattern whereupon the mold pattern is used to cast plate 13. Also within the scope of this invention is to pass milling cutter tool 101 at orientations not previously described in order to produce free standing pin fins of other shapes. Additionally, by raising or lowering milling cutter tool 101 and/or indexing milling cutter tool 101 at values of X outside the selected range of 0.25 to 4 units, the size and shape of truncated portion 29 may be altered.

In like fashion, molds for producing a variety of articles may be machined into suitable material with milling cutter 101 to produce a mold similar in scope to heat plate 13 of FIG. 1, whereupon another suitable material is molded. The ensuing product has a reverse image of the mold. Products molded from foamed elastomeric materials may be advantageously used directly as acoustic wall, floor or ceiling panels or mounted to rigid wall, floor or ceiling material. It is believed by the inventor hereof that an anechoic chamber built of panels molded from a foamed material as herein described will have superior acoustic qualities as the bulbous fins or free standing bulbous portions will capture sound therein more readily.

Referring now to FIG. 9, a fluted side cutting milling cutter is generally shown by the number 121, fluted milling cutter 121 having a plurality of identical flutes 136 disposed around a peripheral surface 122 thereof. Fluted mounting milling cutters are well known in the art and the details construction thereof is not again described herein. Fluted cutter 121 may be used to cut grooves in a plate establishing elongated fins 26 of heat plate 13 and/or heat receiving plate 72, plates 13, 72 shown left side of FIG. 1, however, fluted milling cutter 121 is more advantageously used to produce free standing heat dissipating pin fins 12, 12' shown on the right hand side of FIG. 1. As set forth above, placement of circular base objects such as circular base pins 12 in a close pack relationship naturally occurs in the 120° orientation shown in the central portion of the right hand side of FIG. 1, whereupon a fluted milling cutter 121 may readily be used to create plate 13 as will be hereinafter explained. Preferably, cutting edge profile 123 of flutes 135 of fluted milling cutter 121 comprises a lower radius portion 125, a middle convex portion 124 and a terminal portion 127, lower radius portion 125 having a center 125 on a rotational axis 126 of fluted milling cutter 121, middle convex portion 124 defined by an inverse square curve of form $Y=1/X^2$ wherein profile has values of X between 0.25 units and 4 units. Cutting surface 123 is described in part by a portion 124 of an inverse square curve, portion 124 joined to a radius 125 disposed on centerline 126 of fluted milling cutter 121. Portion 124 is defined between lines 128 and 129 while radius 125 extends from line 128 through centerline 126. Terminal portion 127 completes each flute 136, however, terminal portion 127 is not part of cutting surface 123. Terminal portion 127 may be curvilinear or angled as shown without departing from the scope of this invention. An origin 133 of inverse square curve of portion 124 has a vertical axis 130 offset from rotational centerline 126 of fluted milling cutter tool 121 by a maximum selected value of X for fluted milling cutter 121 and a horizontal axis 131 offset from a tangent 132 of lower radius portion 125 of fluted milling cutter 121 by a value of Y at a selected value of X. As fluted milling cutter 121 is rotated about axis 126, flutes 135 produce opposed inverse square curve curvilinear surfaces 27 of adjacent elongated fins 26 or opposed inverse square curve curvilinear surfaces 14 of free standing pin fins 12, 12', 12A-12D. Circular base free standing pin fins 14 of the right hand side of FIG. 1 and detailed in FIG. 3, are produced by rotating fluted milling cutter 121 around axis 16 thereof thus generating curvilinear surface 12. Multiple circular base pin fins 14 are produced by indexing fluted milling cutter 121 approximately twice the value of selected X orthogonally along an axis of a plate to produce circular base pin fins 12 in straight orthogonal rows 24 and columns 25 as shown at the far right side of FIG. 1 or diagonally, at the 120° orientation previously described whereupon pin fins 12 are produced with a triangular truncated end 29 across a plate to produce circular base pin fins 12 in diagonal rows 24 and columns 25 as shown in the center of FIG. 1. Additionally, it is possible to produce circular base pin fins 12 having circular truncated end 29 by passing fluted milling cutter 121 around each axis 16 of each circular base pin fin 12 while proceeding across plate 13 at a 120° angle and indexing fluted milling cutter 121 a distance equal to twice the value of the selected X into a parallel path. It is also possible, especially with computer controlled machine programs to pass fluted milling cutter 121 around each axis 16 of each circular base pin fin 12 in a sinuous manner along a single row and along all three 120° axes in order to produce plate 13 with free standing circular base pin fins 12 in close pack array as fluted milling cutter 121 will cut at least a 120° peripheral surface of each pin fin 12. Thus, fluted milling cutter 121 cuts around one circular base pin fin 12 and proceeds tangentially to cut around an adjacent circular base pin fin 12. As with rotary milling cutter 101 or a shaping tool with insert 102 therein, it is also possible to produce a mold pattern for use in a molding operation to produce plate 13. For straight fins, as with milling cutter 101, multiple fins 26 may be produced by indexing fluted milling cutter 121 twice the selected value of X thus producing a truncated top portion 29' of fins 26 equal in width to twice the minimum selected value of X. Of course, it is within the scope of this invention to index fluted milling cutter 121 a distance more than the selected minimum value of X thus producing a wider truncated portion 29' or less than the selected minimum value of X thus producing a narrower truncated portion 29', in fact, it is also within the scope of this invention to index fluted milling cutter 121 less than a minimum value of X sufficiently to produce a sharp point for truncated portion 29'.

Referring also to FIG. 6, by passing fluted milling cutter tool 121 at diagonal orientations and/or along at least one orthogonal axis across an un-machined plate, singularly standing pin fins 12A and 12D having an inverse square curvilinear surface may be produced while passing fluted milling cutter tool 121 only along orthogonal orientations, singularly standing pin fins 12A, 12C, 12E with inverse square curvilinear surfaces thereupon are possible. Also within the scope of this invention is to pass fluted milling cutter tool 121 at orientations not previously described in order to produce free standing pin fins of other shapes. Additionally, by raising or lowering fluted milling cutter tool 121 and/or indexing fluted milling cutter tool 121 at values of X outside the selected range of 0.25 to 4 units, the size and shape of truncated portion 29 may be altered. It is also readily apparent that molds may be produced using fluted milling cutter tool 121 such that articles having a reverse image thereof may be molded, the articles having an inverse square curve shape.

Figure 2:
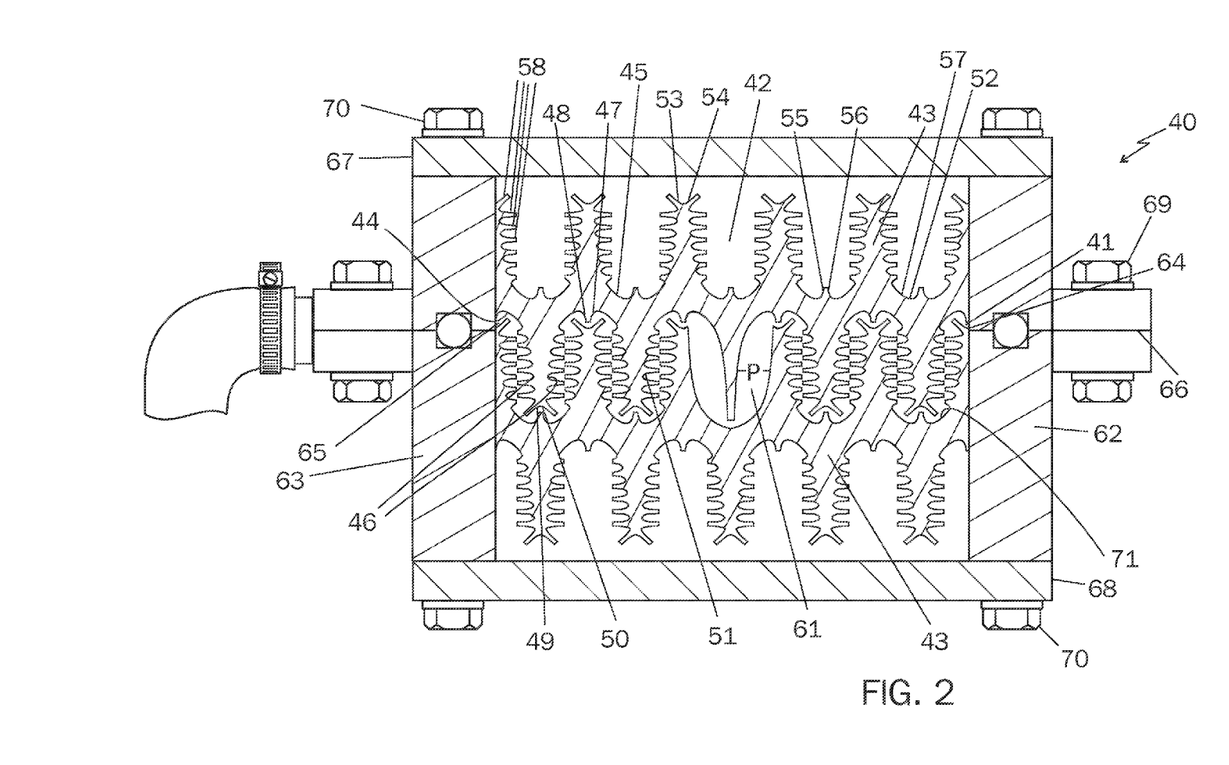
FIG. 2 is a cross sectional view of one tube in a two fluid plate heat exchanger, the hot fluid passage comprising adjoining inverse square curves in sinuous configuration, the hot fluid passage having projections thereinto in the preferred inverse square curve embodiment from the plate material adjacent the cold fluid passage.

Though plate 13 and plate 72 of the left hand side of FIG. 2 have been described as produced with milling cutters 101 or 121 or a shaping tool having insert 102 mounted thereupon, it is fully within the scope of this invention to produce plate 13 and/or plate 72 by extruding an elongated structure having fins 26 formed thereby upon plate 13 and 72 and thereafter cutting the elongated structure into plates 13 and/or 72. In fact, since plate 72 is a exactly like plate 13, one elongated structure may be extruded and thereafter cut into two mating plates 13 and 72 wherein plate 72 is offset from plate 13 upon assembly of the dual heat plate structure depicted in FIG. 1 on the left hand side thereof. Likewise, it is fully possible to form a mold by extrusion of a mirror image of plates 13 and/or 72 and thereafter cast a plate 13 for assembly to a mating plate 72. It is also within the scope of this invention to produce a mold pattern exactly like plate 13 and/or 72 and thereafter use the mold pattern to produce plates 13 and/or 72 in a casting operation. The process of extrusion of elongated plates is well known in the art and need not be repeated here.

Figure 4:
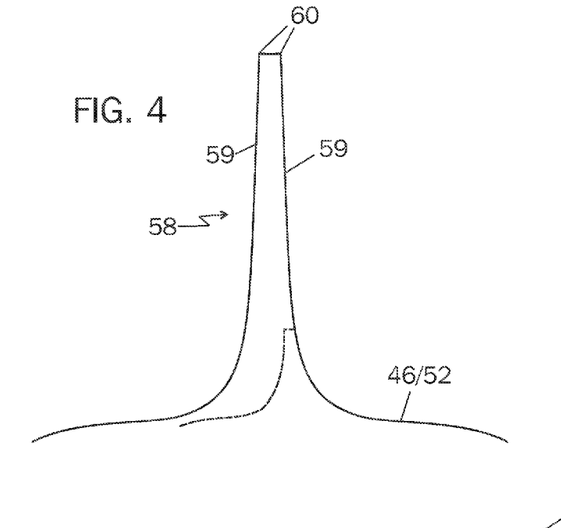
FIG. 4 is an enlarged view of a fin projecting into a fluid passage in the two fluid plate heat exchanger of FIG. 2.

Referring now to FIG. 2, a cross section through a heat exchanger 40 shows at least one first fluid passage 41 contiguous with at least one second fluid passage 42, first fluid passage 41 separated from second fluid passage 42 by a common boundary 43. Common boundary 43 has a first surface 44 and a second surface 45, first surface 44 described by a plurality of curvilinear surfaces 46 joined at the base ends 47, 48 and terminal ends 49, 50 thereof into a sinuous curvilinear surface 51. Second surface 45 is described by a plurality of curvilinear surfaces 52 joined at terminal ends 53, 54 and base ends 55, 56 thereof into a sinuous curvilinear surface 57 wherein curvilinear surfaces 46, 52 of first and second surfaces 44, 45 are defined by a portion of an inverse square curve having the general formula $Y=1/X^2$. Preferably, as shown in FIG. 2, second surface 45 is a mirror image of first surface 44 but offset by one curvilinear surface 46, 52 and thus base ends 55, 56 of second surface 45 are disposed in vertical alignment with terminal ends 49, 50 of first surface 44 thus providing for the smallest possible thickness of common boundary 43 therebetween. A significant savings in material cost is achieved by the arrangement just described, however, it is fully within the scope of this invention to make second surface 45 a duplicate of first surface 44, second surface 45 displaced from first surface 44 by a specified distance such that terminal ends 53, 54 of second surface 45 align with terminal ends 49, 50 of first surface 44 and base ends 55, 56 of second surface 45 align with base ends 47, 48 of first surface though there is generally more mass then associated with boundary 43. With respect to FIG. 2, it is fully understood that fluid passages 41, 42, as well as boundary 43 are elongated in nature and extend into the view depicted. Therefore, a fluid may be disposed below boundary 43 adjacent bottom plate 68 while another or like fluid is disposed above boundary 43 adjacent top plate 67, heat from one fluid transferred to the other fluid through boundaries 43. Preferably, boundaries 43 are formed from a metal selected for highest heat conduction and is constructed as depicted in FIG. 2. Boundaries 43 may be machined from solid material, however, are most readily formed by extrusion through a die producing the shape depicted in FIG. 2. Though boundaries 43 may have smooth curvilinear surfaces 46, 52 as generally described above and as shown centrally located in first fluid passage 41 between sinuous curvilinear surfaces 51 and 71 hereinafter described, it is preferred that curvilinear surfaces 46, 52 have fins 58 projecting outwardly therefrom, fins 58 generally in the form of the inverse square curve $Y=1/X^2$. Therefore, first surface 44 of heat exchanger 40 has a plurality of fins 58 extending therefrom into first fluid passage 41, fins 58, best shown in FIG. 4, comprises mirror image curvilinear surfaces 59 joined at the apices 60 thereof, curvilinear surfaces 59 defined by a portion of an inverse square curve. Likewise, it is preferred that second surface 45 of heat exchanger 40 also has a plurality of fins 58 extending therefrom into second fluid passage 42, fins 58 comprising mirror image curvilinear surfaces 59 joined at the apices 60 thereof, curvilinear surfaces 59 defined by a portion of an inverse square curve. Fins 58 also extend longitudinally into the view shown in FIG. 2 thus creating an elongated planar heat exchanger as heat exchanger 40. Fins 58 may have an aspect ratio of height to base width of about 4, however, fins 58 may be truncated at apices 60 into a shorter aspect ratio as shown in dashed lines in FIG. 4. Of course, fins 58 may alternately have an aspect ratio greater than 4, however, it has been found by the inventor hereof that aspect ratios greater than 4 are more difficult to produce. By providing fins 58 on curvilinear surfaces 46, 52 of first and second surfaces 44, 45, the greatest rate of heat transfer between a fluid in fluid passage 41 to a fluid in fluid passage 42 may be achieved while minimizing the quantity of material used for boundaries 43.

Preferably, heat exchanger 40 has first fluid passage 41 defined between two second fluid passages 42, first fluid passage 41 separated from second fluid passages 42 by separate boundaries 43 between first fluid passage 41 and two second fluid passages 42, separate boundaries 43 separated by a defined distance P, first fluid passage 41 thus comprising a sinuous path 61 through heat exchanger 40. Sinuous path 61 is created between sinuous curvilinear surface 51 of first surface 44 on one boundary 43 and a duplicate sinuous curvilinear surface 71 of first surface 44 on the other boundary 43. Heat exchanger 40 would typically be used for heat transfer between a liquid flowing through first fluid passage 41 with air passing through fluid passages 42 such as a radiator of a vehicle. The liquid in first fluid passage 41 would pass through sinuous path 61 from right to left in FIG. 2 while air in fluid passage 42 would pass in the direction into or out from the view. Of course, heat exchanger 40 may have liquids in both passages 41, 42 by placing additional headers (not shown) on the opposed ends of heat exchanger 40, one opposed end at the face of the view while the other is spaced substantially behind the view, to provide for introduction and discharge of the fluid in second fluid passage 42. Heat exchanger 40 in FIG. 2 is especially useful in the medical field or in food service as heat exchanger 40 may be readily disassembled and cleaned. First fluid passage 41 is separable into two distinct halves by splitting heat exchanger 40 in half along parting line 66 by removing parting line bolts 69 but without removal of top plate 67 and bottom plate 68. Top and bottom plates 67, 68 are held to header plates 62, 63 with plate bolts 70 which pass through top plate 67 and are secured into headers 62, 63 and through bottom plate 68 and secured into headers 62, 63. It is readily apparent that upon removal of top and bottom plates 67, 68, second fluid passages 42 may be readily accessed and cleaned as the entirety of second surface 45 is exposed. Likewise, first fluid passage 41 may be easily cleaned as the entirety of sinuous curvilinear surface 51 comprising first surface 44 is exposed upon splitting first fluid passage 41 at parting line 66.

Heat exchanger 40 may further comprise a plurality of first fluid passages 41 separated by boundaries 43 from a plurality of second fluid passages 42, first fluid passages 41 joined by headers 62, 63 on opposed ends 64, 65 thereof, one header 62, comprising an inlet header while the opposite header 63 comprises an outlet header. Preferably, in a planar heat exchanger, such as heat exchanger 40 in FIG. 2, the number of passages in the plurality of second fluid passages 42 would exceed the number of passages in the plurality of first fluid passages 41, usually according to the expression n+1. In a tube bundle heat exchanger, however, first fluid passages 41 are supported in an enlarged cylinder by tube sheets as headers 62, 63 and therefore, second fluid passage 42 may be considered to be a single fluid passage. Thus, the number of first fluid passages 41 greatly exceeds the number of second fluid passages 42.

Figure 7:
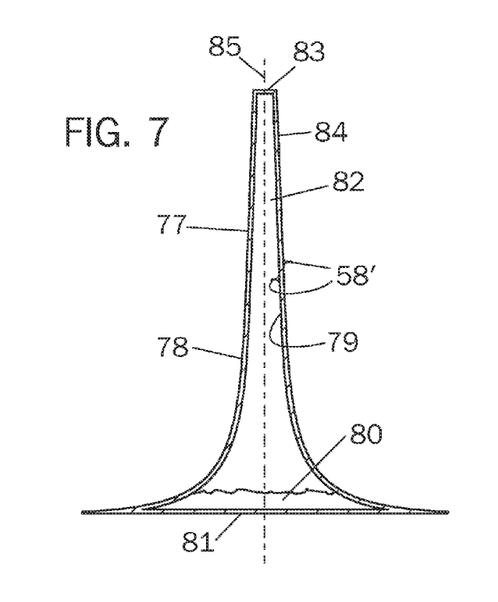
FIG. 7 is an enlarged view of a heat pipe in the preferred inverse square curve embodiment.

Referring now to FIG. 7, a heat pipe 77 is shown in cross section wherein heat pipe 77 has an internal volume 82 partially filled with a liquid 80. In a heat pipe such as heat pipe 77, heat is applied to base 81, liquid 80 boils and rises toward tip 83 of heat pipe 77, the vapor condensing on an interior surface 79 of heat pipe 77 giving off heat to the surroundings. In the instant invention, since heat pipe 77 has internal surface 79 and external surface 78 in the general form of an inverse square curve, both external surface 78 and internal surface 79 are constant temperature lines thus rapidly transferring heat into wall 84 of heat pipe 77 and radiating heat from external surface 78. As internal surface 78 is preferably in the shape of the inverse square curve, condensation moves rapidly downward along inside surface 78 toward base 81 thus entering the remaining portion of liquid 80 for reheating thus providing for a continuous cycle of heat transfer. Heat pipe 77 is preferably of cylindrical shape similar to forged pin fins 12 described above, though hollow, and thus has an axis 85 passing centrally therethrough although it is fully within the scope of this invention to make heat pipe 77 as an elongated bar closed at both ends to ensure containment of liquid 80. Though it is preferred that both internal surface 79 and external surface 78 are portions of an inverse square curve, either surface may be another shape without departing from the scope of this invention. It is also within the scope of this invention to invert heat pipe 77 such that liquid volume 80 is adjacent end 83 wherein heat is applied to end 83, the vapor produced by the boiling thereof rising upwardly toward base 81 and condensing on internal surface 79 thus transferring heat through wall 84 to external surface 78 and radiating heat to the surroundings, the condensed liquid returning along internal surface 79 to liquid volume 80 for reheating. Furthermore, though tip 83 is shown to be flat, tip 83 may be formed in any manner such as curvilinear or pointed. Additionally, either external surface 78 or internal surface 79 may have fins 58' affixed thereto in the same manner as discussed above with fins 58 disposed into fluid passages 41, 42 of heat exchanger 40. Fins 58' may be of any shape, however, it is preferred that fins 58' have at least a portion thereof in the shape of the inverse square curve. Finally, though base 81 is shown in FIG. 7 to be flat, base 81 may also be a portion of an inverse square curve and thus heat pipe 77 may be attached to a much larger heat pipe, wherein heat pipe 77 thus becomes a fin 81'.

Still referring to FIG. 7, a cooling tower may be formed in the same general shape by removing base 81 and tip 83 wherein heated water is sprayed through injectors into an air stream passing upwardly through internal volume 82, the heated water giving up heat to the air stream in proportion to the dry bulb temperature of the incoming air. In a cooling tower, internal surface 79 is a surface of revolution spaced at an extended radius from axis 85 though still retaining the general shape of the inverse square curve. Base 81 and tip 83 are obviously also enlarged, however, base 81 and tip 83 are open for passage of air therethrough. Though cooling towers generally have an hyperbolic shape, it has been found by the inventor hereof that the inverse square curve shape of internal surface 79 enhances the velocity of air flow from the base thereof therefore enhancing heat transfer to the air stream at the water injectors.

Figure 10:
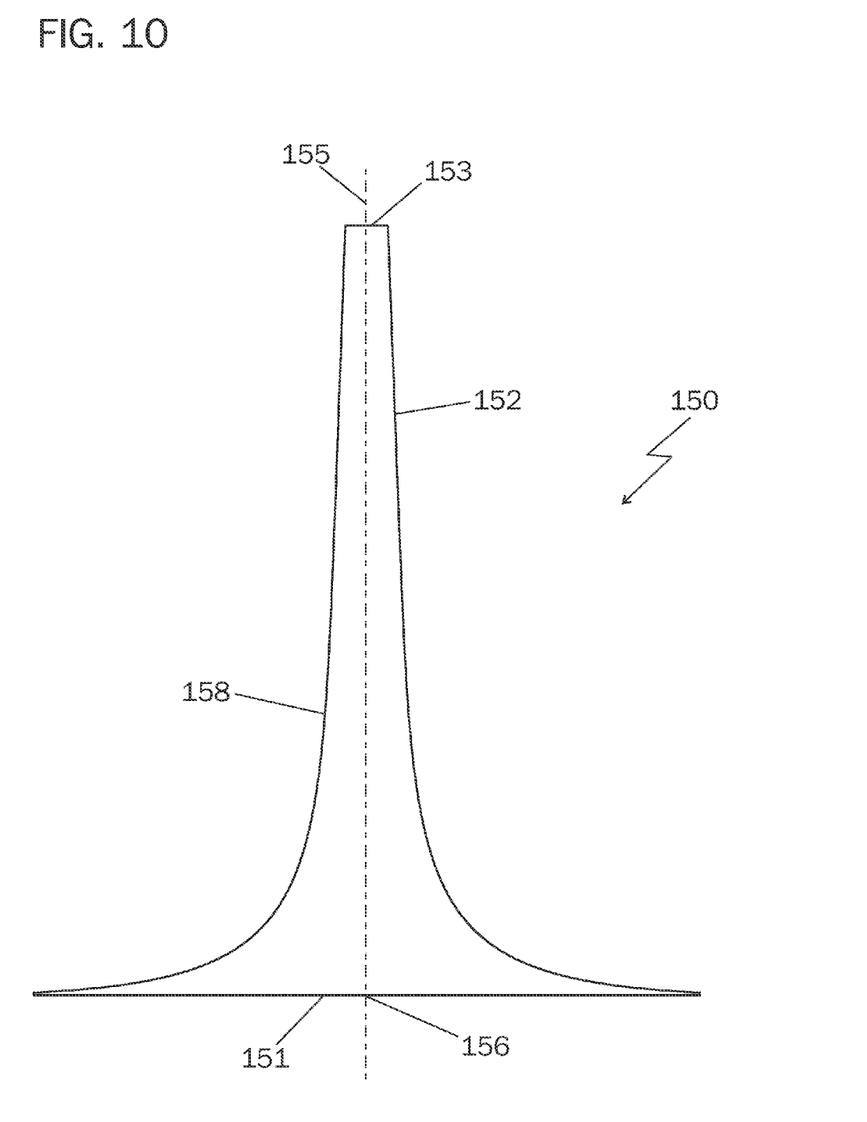
FIG. 10 is a top plan view of a shaper cutter insert provided with an inverse square curve cutting surface.

Referring now to FIG. 10, a material forming tool is generally shown by the numeral 150, forming tool 150 comprising a concave surface of revolution 152 wherein a profile 158 of surface 152 is defined by an inverse square curve of form $Y=1/X^2+C$ and where $C=0$, inverse square curve having an origin 156 on a centerline 155 and a base 151 of tool 150. Surface 152 of tool 150 generally lies between $0.25<X<4$ and thus must be truncated at a minimum selected value of X. Accordingly, tool 150 has a truncated portion 153, shown as a flat surface in FIG. 10, however, truncated portion 153 may be rounded or conical. For a small forming tool, such as used to form heat pipes of FIG. 7, the value of C generally equals 0 and a transition area 154 is also provided between truncated portion 153 and surface 152, transition area 154 generally comprising a small radius of up to one-sixteenth of an inch to facilitate material forming without tearing the material. A small tool 150 may thus be used to draw material onto surface 152 to form objects having an inverse square curve form or alternately, small tool 150 may force the selected material into a mating die. By making an array of formed objects into a sheet, a tube sheet may be produced which is useful in a dual fluid heat exchanger 40 similar to that shown in FIG. 2. Likewise, funnels, nozzles, musical instrument bells, acoustic drums and the like may be produced. Preferably, a small tool 150 may be solid as shown in FIG. 10, however, a hollow tool 150 may be made as well. Preferably, dual fluid heat exchanger 40 shown in FIG. 2 is made by extrusion die plates having opposed first surface 44 and second surface 45 are extruded into elongated structures which are then cut to length for particular heat exchangers 40. An extrusion die would have a mirror image of common boundary plates 43, wherein elongated pins 58 are simultaneously produced with surfaces 46.

Alternately, a larger tool 150 may be formed by setting C equal to a value greater than zero such that surface of revolution 152 is larger in diameter at base 151 and at truncated end 153. A larger forming tool 150 may then be employed to spin form sheets of material into fan housings, air intake plenums, water intake plenums, washing machine doors with mating housing, large funnels or antennae such as shown in FIG. 5. Still, in another alternate embodiment, a tool 150 may be made negative such that $C=-0.5$ and X lies between 0.5 and 1.0 to punch into deformable material such as rigid foam or rigid fiber panels to make acoustic ceiling or wall panels. Though there are several alternate tool forms described for producing several different products, it is fully within the scope of this invention to produce other tool forms and products therefrom.

Referring now to FIG. 5, curvilinear surfaces 31, 31' may also be used as an antenna for receiving electromagnetic waves thereonto, the electromagnetic waves proceeding along curvilinear surfaces 31, 31' to ends 33, 33' wherein the electromagnetic waves are received in a receiver 86 replacing heat source 32. Thus, curvilinear surfaces 31, 31' function as directors to direct the electromagnetic waves to receiver 86.

Forged pin fin heat sink 10 may be manufactured by numerous methods, however, preferably is formed as an elongate plate 13 of specified width having circular base forged pin fins 12 affixed thereto. Forged pins 12 may be affixed to plate 13 in any conventional manner and are most preferably affixed by bolts passing through underside 21 into each circular base forged pin fin 12. Plurality 11 of circular base forged pin fins 12 are arranged on plate 13 in rows 24 and columns 25 preferably with bases 18 substantially touching. As hereinbefore recited, rows 24 and columns 25 may be evenly disposed on plate 13 or may be offset in order to ensure complete packing of upper surface 17. Receiver plate 72 may be similarly constructed with rows and columns 25 spaced for interdigitation with rows 24 and columns 25 on plate 13. Circular base forged pin fins 12 are preferably solid material and may be cold-headed, machined, cast or forged and are most preferably of steel, however, any suitable metal may be used. Furthermore, circular base forged pin fins 12 may be clad with another metal. In an alternate method of manufacture, pin fins 12 may be machined on plate 13 from a solid material plate of a thickness to fully encompass the full height of pin fins 12 and thickness of plate 13, pin fins 12 formed by passing a cutting tool of suitable shape at 120 degree angles across surface 17 of plate 13. A cutter of mating shape, in this case, substantially the reverse of circular base forged pin fin 12, is inverted and rotated about its axis while being passed at the specified cross angles across upper surface 17 of plate 13 thus leaving pin fins 12 having a generally triangular base 19 and triangular top 19. It should be readily apparent then that plate 72 may be similarly constructed with the rows 24 offset from end 87 of plate 13 by one half of the diameter of base 81 and columns 25 offset from edge 88 of plate 13 by a similar distance. Thus, pin fins 12' may be of the same height as pin fins 12 and may be readily interdigitated with the triangular tops thereof received in the triangular cut formed between adjacent rows 24 and columns 25 with the tops resting directly upon upper surface 17 of plate 13. Likewise, circular base forged pin fins 12 may be interdigitated with triangular based pin fins 12 provided that the spacing of rows 24 on receiver plate 72 is a multiple of the spacing of the rows 24 on plate 13. It should be readily apparent here that other shapes for pin fins 12 such as those shown in FIG. 6 may be arranged upon base 13 of heat sink 10 and interdigitated with pin fins 12' of similar or different shape on plate 72 wherein a tortuous path is established between the interdigitated pin fins 12, 12' thus improving the efficiency of forged pin fin heat sink 10.

In another alternate embodiment, elongated fins 26 may be disposed on upper surface 17 of plate 13 by arranging elongated fins 26 regularly upon plate 13 and affixing elongated fins 26 thereto. Elongated fins 26 may be affixed by conventional fasteners or may be welded to upper surface 17. Elongated fins 26 may be machined individually or may be cast or forged from suitable materials with bases 28 of elongated fins 26 touching or spaced apart as hereinbefore recited. Receiver plate 72 may also have elongated fins 26 disposed thereupon wherein fins 26 on plate 13 are offset from pins 26' of receiver plate 72. It is also possible to interdigitate plate 72 having elongated fins 26 disposed thereupon with heat plate 13 having rows 24 and columns 25 of pin fins 12 thereupon, elongated fins 26 arranged between adjacent rows 24.

Heat exchanger 40 is manufactured by extruding elongated common boundaries 43 from a suitable metal, common boundaries 43 having first surface 44 on one side thereof and second surface 45 on the other side. At least two common boundaries 43 are then affixed to headers 62, 63 but spaced apart by a distance equal to distance P thus establishing fluid passage 41 therebetween. Additional common boundaries may be similarly joined to headers 62, 63 to make an elongated heat exchanger 40 for industrial, automotive and home uses. For such an elongated heat exchanger 40, additional headers (not shown) are disposed on the side edges of fluid passages 41 to thus contain the fluid passing therethrough, the additional headers generally covering fluid passages 41 while leaving fluid passages 42 open for passing of another fluid therethrough. Top and bottom plates 68, 69 respectively are then affixed to headers 62, 63 with bolts passing through top and bottom plates 68, 69 into headers 62, 63. Since heat exchanger 40 is so simply constructed, heat exchanger 40 may be easily disassembled thus providing for easy cleaning of fluid passages 41, 42. Heat exchanger 40 is thus highly sought for food service purposes.

Curved plate 37 is made by forming a sheet of material against a form having the shape depicted in FIG. 5. Where curved plate 37 is used for a heat plate, preferably the material is metallic thus allowing for heating of curved plate 37 as well as radiation therefrom, however, where curved plate 37 is used as an antenna, the preferred material is one of the thermoplastics selected from the group including polytetrafluoroethylene, polypropylene, polyethylene, polyamide, polyparabenzamide, silicone, viton, chloroprene, ethylene propylene polymer, isoprene, butyl, polystyrene or combinations thereof as now widely used industry. The thermoplastic material may also contain reinforcing materials such as fiberglass, metal fibers, thermoplastic fibers or carbon fibers. Curved plate 37 may be made into a surface of revolution by rotating a sheet of material about an axis and forming the sheet into the inverse square curve shown in FIG. 5 wherein curved plate 37 may be used for a variety of purposes.

Preferably, heat pipe 77 is made from a cylindrical metallic tube having internal surface 79 formed in the shape of the inverse square curve by rotating the cylindrical metallic tube about axis 85 while pressing a forming tool against internal surface 79. By so shaping internal surface, wall 84 substantially assumes the same shape thus forming external surface 78 into the general shape of the inverse square curve. One end, 81, 83 is then sealed by affixing a cap to the respective end of wall 84, fluid 80 is added and the other end 83, 81 is sealed to wall 84 thus producing an hermetically sealed container for transfer of heat from a heated surface below base 81 toward top end 83. Heat pipe 77 may be made from copper or an alloy thereof, however, it is possible to make heat pipe 77 from the metals selected from the group consisting of iron, copper, steel, zinc, titanium, platinum or alloys thereof.

A cooling tower may be formed of metals, wood, thermoplastics, cement board, fiberglass affixed to a frame wherein the wall of the cooling tower is shaped into the form of the inverse square curve while being affixed to the frame. Sheets of the wall of the cooling tower may be preformed into the general shape of the inverse square curve prior to being attached to the frame. Likewise, an antenna may be formed onto a frame or have sheets preformed before affixing to the frame.

While the present invention has been described with reference to the above described preferred embodiments and alternate embodiments, it should be noted that various other embodiments and modifications may be made without departing from the spirit of the invention. Therefore, the embodiments described herein and the drawings appended hereto are merely illustrative of the features of the invention and should not be construed to be the only variants thereof nor limited thereto.

I claim:

1. A rotary cutting tool for forming a heat plate has a plurality of cutting blades disposed axially upon and circumferentially about a cutting tool body, said rotary cutting tool having a cutting edge profile comprising a lower radius portion and a middle convex portion, said lower radius portion having a center on a rotational axis of said rotary cutting tool, said middle convex portion defined by an inverse square curve of form $Y=1/X^2$ wherein said profile has values of X between 0.25 units and 4 units and wherein a vertical axis of an origin of said inverse square curve is offset from said rotational axis of said rotary cutting tool by a maximum selected value of X and a horizontal axis of said origin of said inverse square curve is offset from a tangent of said lower radius portion of said rotary cutting tool by a value of Y at said selected value of X.

2. A rotary cutting tool as in claim 1 wherein said lower radius portion of said cutting edge profile has a radius of at least one-sixteenth unit.

3. A rotary cutting tool as in claim 1 wherein said lower radius portion of said cutting edge profile has a radius of one-half unit.

4. A rotary cutting tool as in claim 3 wherein said maximum value of X is 2 units.

5. A rotary cutting tool as in claim 1 wherein said profile has values of X from 0.5 to 2.5 units.

6. A heat plate formed with the rotary cutting tool of claim 1.

\* \* \* \* \*